(12) United States Patent
Hoffman et al.

(10) Patent No.: US 8,971,364 B2
(45) Date of Patent: Mar. 3, 2015

(54) DRIVING CIRCUIT FOR ANALOG-MODULATED DIODE-LASER

(75) Inventors: Gilbert A. Hoffman, Aloha, OR (US); Richard J. Farmer, Portland, OR (US)

(73) Assignee: Coherent, Inc., Santa Clara, CA (US)

( * ) Notice: Subject to any disclaimer, the term of this patent is extended or adjusted under 35 U.S.C. 154(b) by 319 days.

(21) Appl. No.: 13/009,625

(22) Filed: Jan. 19, 2011

(65) Prior Publication Data
US 2012/0183005 A1 Jul. 19, 2012

(51) Int. Cl.
*H01S 3/00* (2006.01)
*H01S 5/068* (2006.01)
*H01S 5/042* (2006.01)

(52) U.S. Cl.
CPC ........... *H01S 5/06808* (2013.01); *H01S 5/0427* (2013.01); *H01S 5/06812* (2013.01)
USPC ................... 372/38.02; 372/38.01; 372/38.07

(58) Field of Classification Search
CPC .. H01S 5/0427; H01S 5/0428; H01S 5/06835
USPC ................................. 372/38.01, 38.02, 38.07
See application file for complete search history.

(56) References Cited

U.S. PATENT DOCUMENTS

| | | | |
|---|---|---|---|
| 4,385,387 A | 5/1983 | Trimmel | |
| 5,127,015 A | 6/1992 | Chikugawa et al. | |
| 5,140,603 A | * 8/1992 | Anderson et al. | 372/29.02 |
| 5,430,749 A | 7/1995 | Horie | |
| 5,978,393 A | 11/1999 | Feldman et al. | |
| 6,192,060 B1 | * 2/2001 | Kobayashi | 372/38.01 |
| 6,707,833 B1 | 3/2004 | Kimbrough | |
| 7,002,128 B2 | 2/2006 | Hedin et al. | |
| 7,660,336 B2 | 2/2010 | Knotz | |
| 7,756,173 B2 | 7/2010 | Alfrey | |
| 7,782,916 B2 | 8/2010 | Hayashi | |

FOREIGN PATENT DOCUMENTS

| | | |
|---|---|---|
| JP | 4-83660 A | 3/1992 |
| JP | 2002-299754 A | 10/2002 |
| JP | 2007-329212 A | 12/2007 |
| JP | 2008-034460 | * 2/2008 |

OTHER PUBLICATIONS

International Search Report and Written Opinion received for PCT Patent Application No. PCT/US2012/021258, mailed on May 7, 2012, 12 pages.

* cited by examiner

*Primary Examiner* — Tod T Van Roy
(74) *Attorney, Agent, or Firm* — Morrison & Foerster LLP

(57) ABSTRACT

A diode-laser is driven by a modulated voltage through a voltage-to-current converter. The modulated voltage has a fixed level determined by an applied fixed bias voltage and a variable level determined by a modulation voltage signal varying between minimum and maximum values. The fixed voltage level corresponds to a threshold level above which the diode-laser would provide laser-output. The modulation voltage signal is monitored and compared with a predetermined set value. If the monitored voltage signal falls below the set value, the modulated voltage is disconnected from the voltage-to-current converter and the output of the diode-laser falls to zero.

20 Claims, 9 Drawing Sheets

DRIVING CIRCUIT FOR ANALOG-MODULATED DIODE-LASER

TECHNICAL FIELD OF THE INVENTION

The present invention relates in general to driving circuitry for diode-lasers. The invention relates in particular to driving circuitry for analog-modulated diode-lasers.

DISCUSSION OF BACKGROUND ART

Diode-lasers with analog-modulated output are used as illumination sources in confocal microscopy. Diode-lasers are typically driven (powered) by a variable direct current (DC) supplied by a simple voltage-to-current converter. The current is varied by varying a DC voltage applied to the converter with a linear relationship between the current and the voltage. In confocal microscopy, it is usually desired that the diode-laser power (light-output) be modulated from zero to some maximum value in a ramp or "sawtooth" wave-form.

A preferred way of achieving this modulation form is to drive the diode-laser using a comparable voltage wave-form applied to the current converter. This is complicated by the fact that a certain threshold level of voltage (and corresponding current) is required before laser-action is initiated in the diode. At a voltage less than the threshold voltage, the diode will emit light (radiation) in the form of spontaneous emission or fluorescence. The threshold voltage can be almost one-half of the voltage that produces maximum laser-light output.

This is schematically illustrated in the graph of FIG. 1 which depicts diode-laser power as a function of applied voltage. The curve is representative of the output power response to a linear voltage-ramp. It can be seen that at voltages between zero and the lasing threshold voltage, non-laser light-output increases proportionally but weakly compared with the light-output increase once laser action is established. The entire output curve is a distorted replica of the linear voltage ramp. Any other modulation waveform such a sine-wave would be correspondingly distorted.

A generally practiced method of reducing, if not altogether eliminating the distortion is to apply a fixed bias-voltage (and corresponding current) to the current converter such that, when the modulation voltage is only slightly greater than zero, the lasing threshold voltage is reached. This is schematically illustrated, graphically, in FIG. 2

Here, the bias voltage has been selected such that the lasing threshold is reached when the modulation voltage is only a fraction of a volt. This fractional voltage is selected to be only just sufficient that certain statistical variations can be accommodated. These include variations in the lasing threshold, variations in an externally provided modulation drive signal, and variations in internal signal processing circuitry. The response to the linear voltage ramp is now distorted significantly less than in the example of FIG. 1 without bias. Here, however, it should be noted that at zero modulation voltage there is still some non-laser light-output from the diode-laser. This is not acceptable in the confocal microscopy systems. Accordingly, a modulation method is needed that will provide the minimized output-distortion of the method of FIG. 2 but with zero light-output at zero modulation-voltage.

SUMMARY OF THE INVENTION

In one aspect, a method in accordance with the present invention for driving an analog-modulated diode-laser comprises providing a modulation signal corresponding to a desired modulation profile for the diode-laser. The modulation signal varies in a range between predetermined first and second extreme values with one of the extreme values representing zero output of the diode-laser. A modulated drive-current is generated, the drive-current being the sum of a DC component and modulated component, the modulated component being related to the modulation signal. The diode-laser is driven by the drive-current to provide laser-output. The modulation signal is monitored and compared with a predetermined set value thereof within the range between the extreme values. If the monitored modulation signal falls between the set value and that one of the extreme values of the modulation signal representing zero output of the diode laser, the diode-laser is switched off.

In all but one of the embodiments of the present invention described below, the extreme value representing zero output is a minimum value. Switching off the diode-laser before the modulation signal can reach an extreme thereof representing zero output prevents the diode-laser from being driven by a current sufficiently low that the diode-laser emits only spontaneous emission or fluorescence. This, together with selecting an appropriate DC level for the drive-current provides that the diode-laser output responds essentially linearly to the modulation signal, avoiding any significant distortion of the desired modulation of the diode-laser output.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 3A:
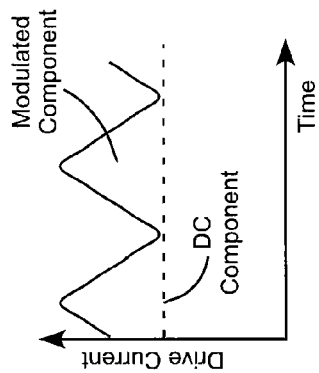
FIG. 3A is a graph schematically illustrating drive-current delivered to a diode-laser in the apparatus of FIG. 3, the drive-current including a DC components and a modulated component.
Figure 3:
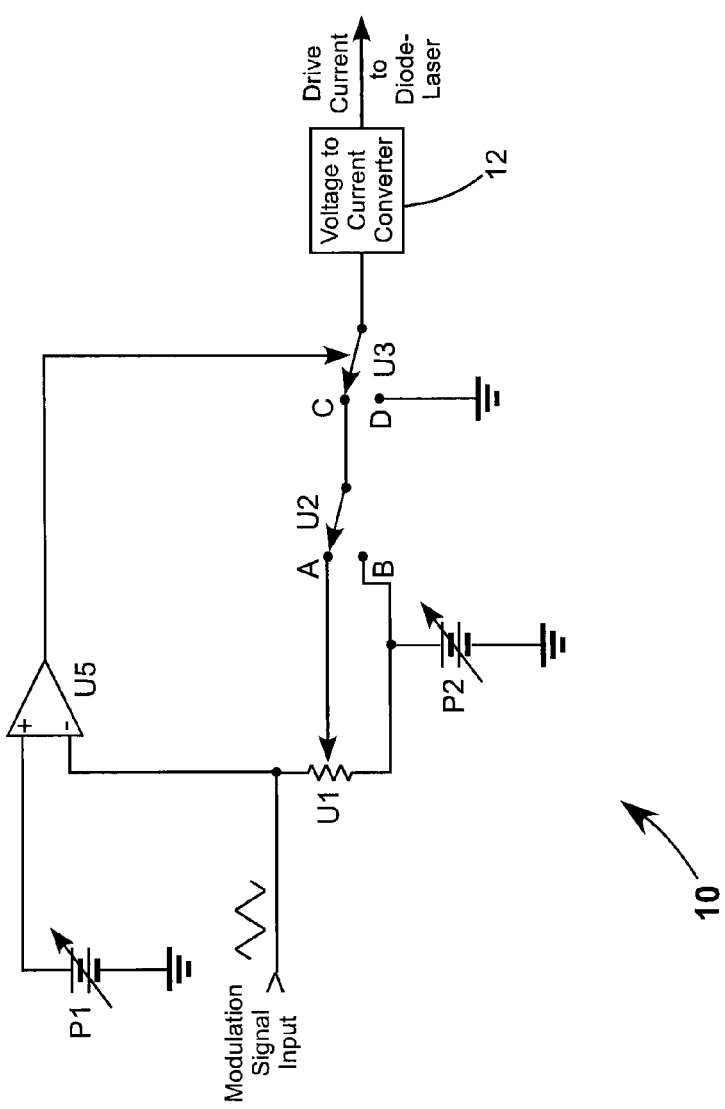
FIG. 3 is a circuit diagram schematically illustrating one preferred embodiment of electronic apparatus in accordance with the present invention for driving an analog-modulated diode-laser, with a voltage-to-current converter arranged to generate a modulated drive-current from a modulated drive-voltage, with the drive-current being directly proportional to the drive-voltage and the drive-voltage input to the current converter being the sum of a fixed bias voltage component and a modulated component.

Continuing with reference to the drawings FIG. 3 schematically illustrates a preferred arrangement 10 of electronic circuitry for driving an analog-modulated diode-laser in accordance with the method to the present invention. A modulation signal (voltage) is input one side of a programmable digital potentiometer U1. This can be described as a potentiometer for adjusting modulation gain. This signal can be provided by an outside source such as a microprocessor or PC. The signal varies between predetermined minimum and maximum values. The minimum value can be zero or some non-zero positive or negative value.

A variable voltage source P2 connected to the other side of potentiometer U1 sets a bias voltage level, and the laser output intensity is determined by a modulated drive-voltage, output from the potentiometer. The modulated drive-voltage is the sum of a fixed bias voltage component and a modulated voltage component. This modulated drive-voltage is transmitted via digital switches U2 and U3 to a voltage-to-current converter 12 which provides a modulated drive-current proportional to the modulated drive-voltage for driving the diode-laser. The modulated drive-current has a fixed bias current component and a modulated current component.

Voltage-to-current converters for driving diode-lasers are well known to practitioners of the art, and a detailed description thereof is not necessary for understanding principles of the present invention. Accordingly, such a detailed description is not presented herein. The term "fixed" as applied to voltage and current components discussed above means that these are essentially DC components. The actual level of these is selectively variable by adjusting voltage source P2.

Switch U2 is user-operable and can be switched to position A for modulated operation of the diode-laser, or to position B for optionally driving the laser in a CW or steady-state mode, with intensity determined by the potential set by P2. Switch U3 is digitally operated in accordance with the present invention by the output (digital high or digital low) of comparator U5.

A variable potential P1 is applied to one input (here, the positive input) of comparator U5 and sets a value below which the modulation signal can be reasonably assumed to be zero. The modulation signal is monitored at the input connection to digital potentiometer U1 and is applied to the other input of comparator U5. If the sampled modulation signal is above the set value, the comparator output is digital low, and switch U3 is in position C with the modulation signal controlling the laser output.

If the sampled modulation signal falls below the set value, the comparator output goes from digital low to digital high, and switch U3 is switched into position D, shorting the modulated drive signal to ground, and cutting off the voltage-to-current converter from the potential-source such that no output current is generated and the diode-laser output is switched off. Because of this, the laser output intensity is in fact zero, and is not some non-zero, spontaneous-emission-determined value resulting from sub-threshold driving of the diode-laser as in prior-art arrangements. If the modulation signal rises from a value below the set level to a value above the set level, the output of comparator U5 goes from digital high to digital low and switch U5 is restored to position C such that the voltage-to-current converter is re-connected to the modulated driving voltage and the diode-laser has some corresponding non-zero laser-output.

FIG. 3A is a graph schematically illustrating drive-current delivered by the voltage-to-current converter in the apparatus of FIG. 3. The current, when "on", comprises a DC component and a modulated component (corresponding to the modulation signal) as illustrated. The drive-current is turned off before the modulation signal reaches the minimum value representing zero output of the diode laser. Here it should be noted that zero diode-laser output may be represented in the modulation signal by a non-zero minimum value. In such a case, the DC level in the drive-current would be related to a sum of bias potential applied via source P2 and the difference between the minimum of the modulation signal and zero. In all other embodiments of the present invention described hereinbelow the drive-current delivered to a diode-laser has the general form schematically depicted in FIG. 3A, but generated in different ways.

A particularly useful feature of the apparatus of FIG. 3 is that the DC component of the drive-current and the modulation depth of the modulated component of the drive current are independently selectively variable, by selectively varying, respectively, source P2 or potentiometer U1. This can be used to optimize the drive-current form for a particular diode-laser. Those skilled in the art will recognize that this selective variability of the drive current form is available in other embodiments of the present invention described hereinbelow.

Figure 1:
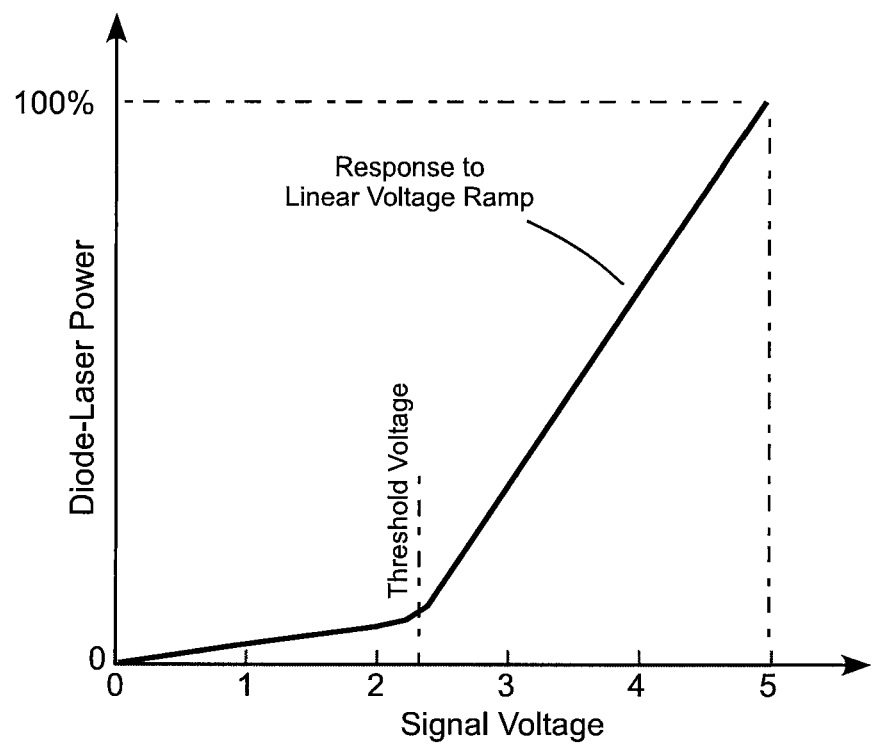
FIG. 1 is a graph schematically illustrating diode-laser power-output as a function of driving voltage in one prior-art driving arrangement for the diode-laser.
Figure 2:
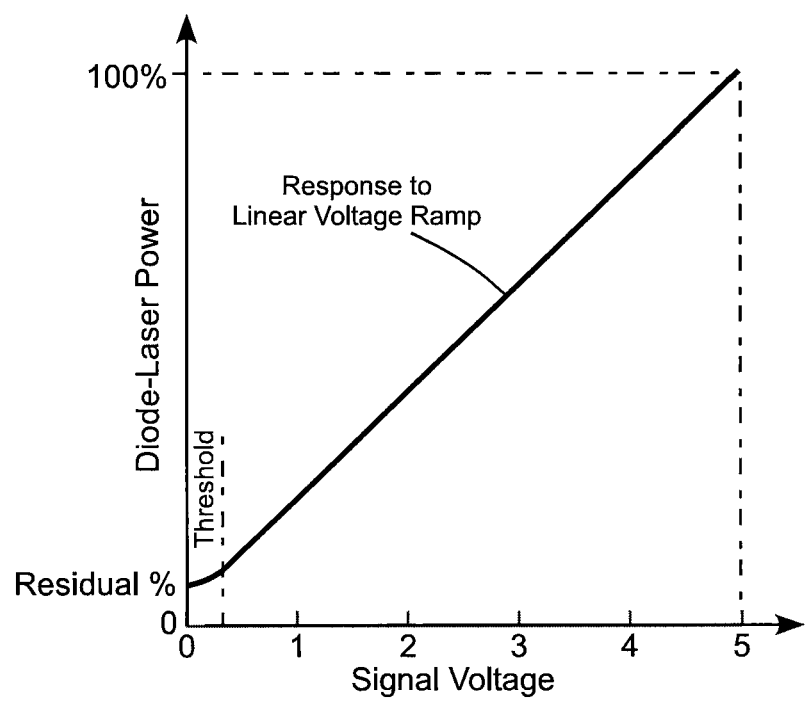
FIG. 2 is a graph schematically illustrating one preferred embodiment diode-laser power-output as a function of driving voltage in another prior-art driving arrangement for the diode-laser.
Figure 4:
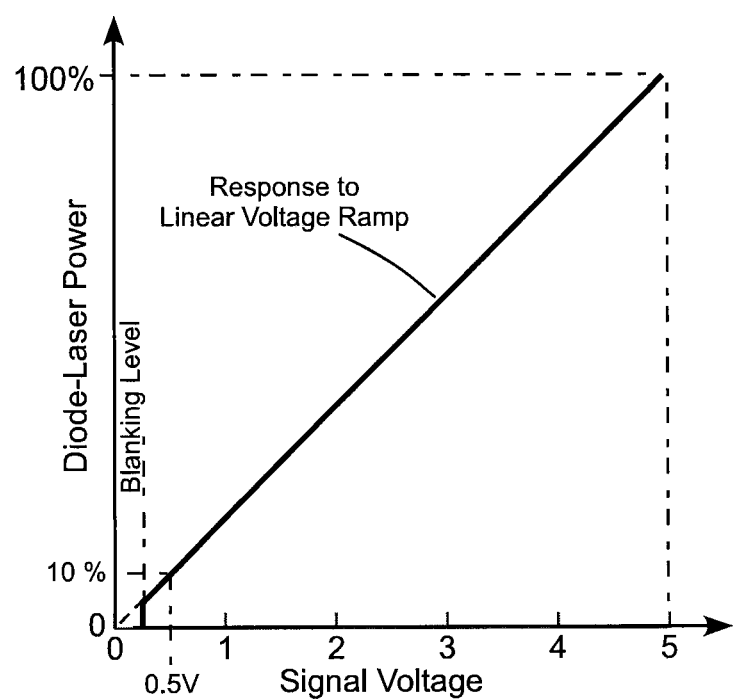
FIG. 4 is a graph schematically illustrating diode-laser power-output as a function of the modulated component of the drive-voltage in the apparatus of FIG. 3.

FIG. 4 is a graph schematically illustrating the diode-laser output intensity as a function of modulation voltage for a diode-laser driven by the circuitry of FIG. 3. Here, the set level (blanking level) for triggering digital switch U3 has been set to correspond to a modulation voltage signal of about 0.2 V. It should be noted here that the actual voltage delivered to the voltage-to-current converter will be equal to the varying modulation voltage plus the fixed bias-level voltage set by source P2, as discussed above. In the example of FIG. 4, the bias level has been set at about the voltage threshold for lasing at a level such that linear (laser-action) part of the intensity versus voltage curve extrapolates to zero intensity at zero signal volts. The set level is selected to be only sufficiently above the minimum value of the modulation signal to accommodate the statistical variations in laser threshold and other parameters discussed above with reference to FIG. 2. This provides that when the laser is lasing (not blanked by switch U3) the laser intensity will be about linearly proportional to the voltage of the modulation signal. By way of example, in FIG. 4, 100% output (maximum) intensity corresponds to a signal voltage of 5.0 V with a signal voltage of 0.5 V providing 10% of the maximum intensity.

Figure 5:
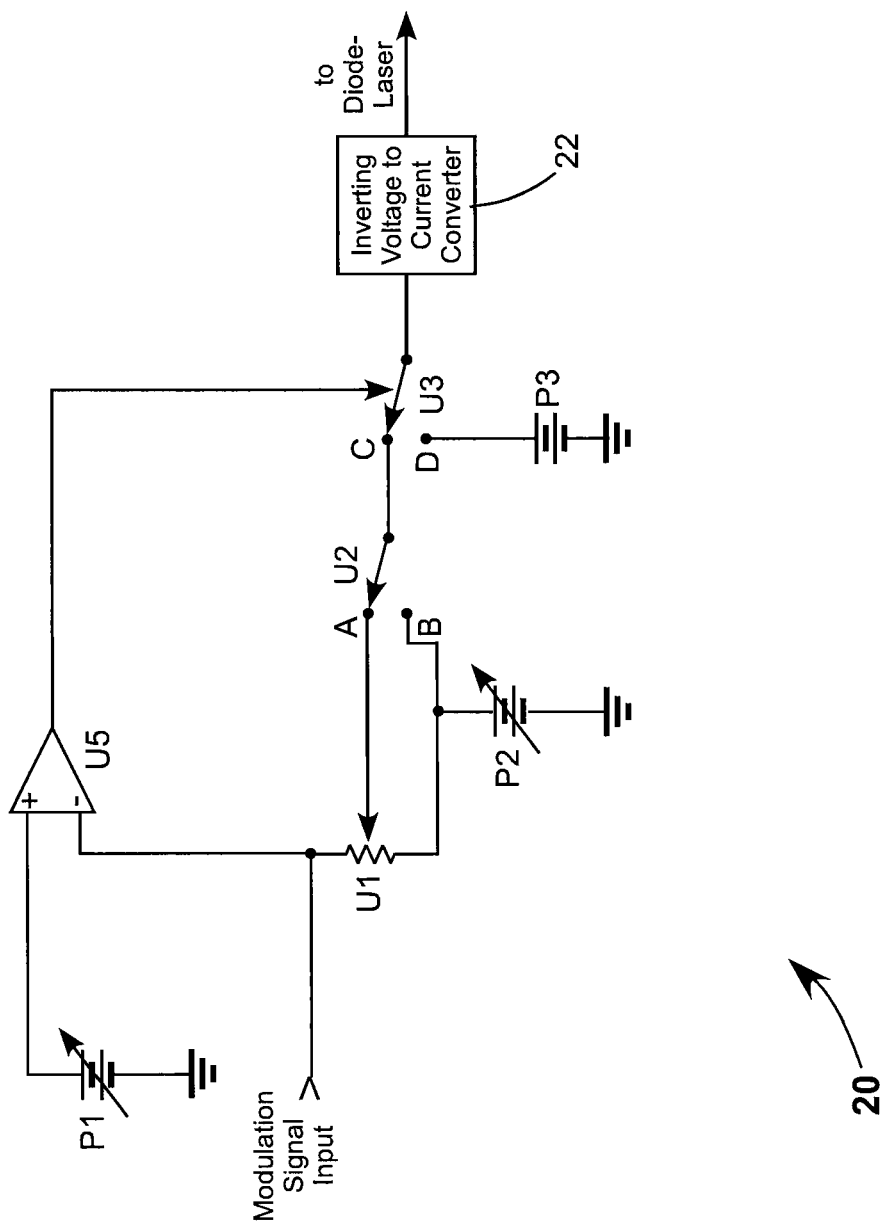
FIG. 5 is a circuit diagram schematically illustrating another preferred embodiment of electronic apparatus in accordance with the present invention for driving an analog-modulated diode-laser, similar to the apparatus of FIG. 3 but wherein the voltage-to-current converter is replaced by an inverting voltage-to-current converter arranged to generate a modulated drive-current from a modulated drive-voltage with the drive-current being inversely proportional to the drive-voltage.

FIG. 5 is a circuit diagram schematically illustrating another preferred embodiment 20 of electronic apparatus in accordance with the present invention for driving an analog-modulated diode-laser. Apparatus 20 is similar to apparatus 10 of FIG. 3 but wherein voltage-to-current converter 12 of apparatus 10 is replaced by an inverting voltage-to-current converter 22. This provides that modulated drive-current converted from a modulated drive-voltage is inversely proportional to the drive-voltage, i.e., the lower the signal voltage the higher the drive-current. Inverting current-to-voltage converters are sometimes preferred by practitioners of the art for various reasons.

Figure 6:
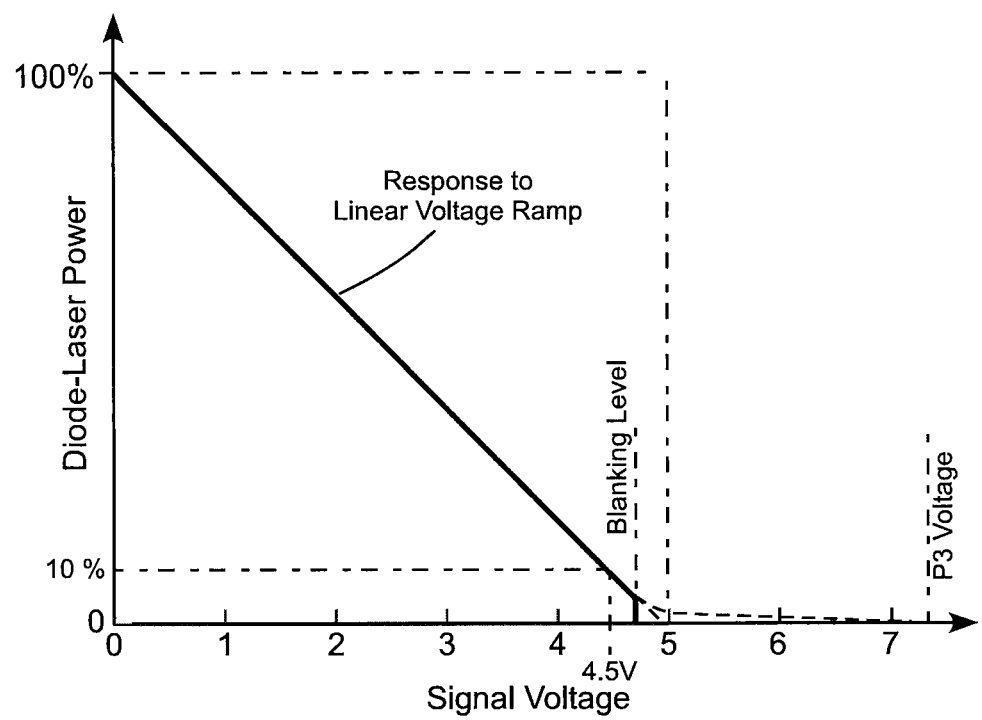
FIG. 6 is a graph schematically illustrating diode-laser power-output as a function of the modulated component of the drive-voltage in the apparatus of FIG. 5.

Functions of apparatus 20 can be understood by reference in addition to FIG. 6 which is a graph schematically illustrating diode-laser power-output as a function of the modulated component of the drive-voltage in the apparatus. Regarding the blanking at near-zero diode-laser output this is done by providing a relatively high set-level (blanking level) voltage as depicted in FIG. 6. The blanking switch U3 is triggered by comparator U5 into blanking position D when the sampled voltage signal exceeds the set-level provided by source P1. In position D, inverting voltage-to-current converter is connected to a potential source P3 which provides a potential high enough that drive-current produced by the converter in response falls to zero and the diode-laser is switched off.

Figure 7:
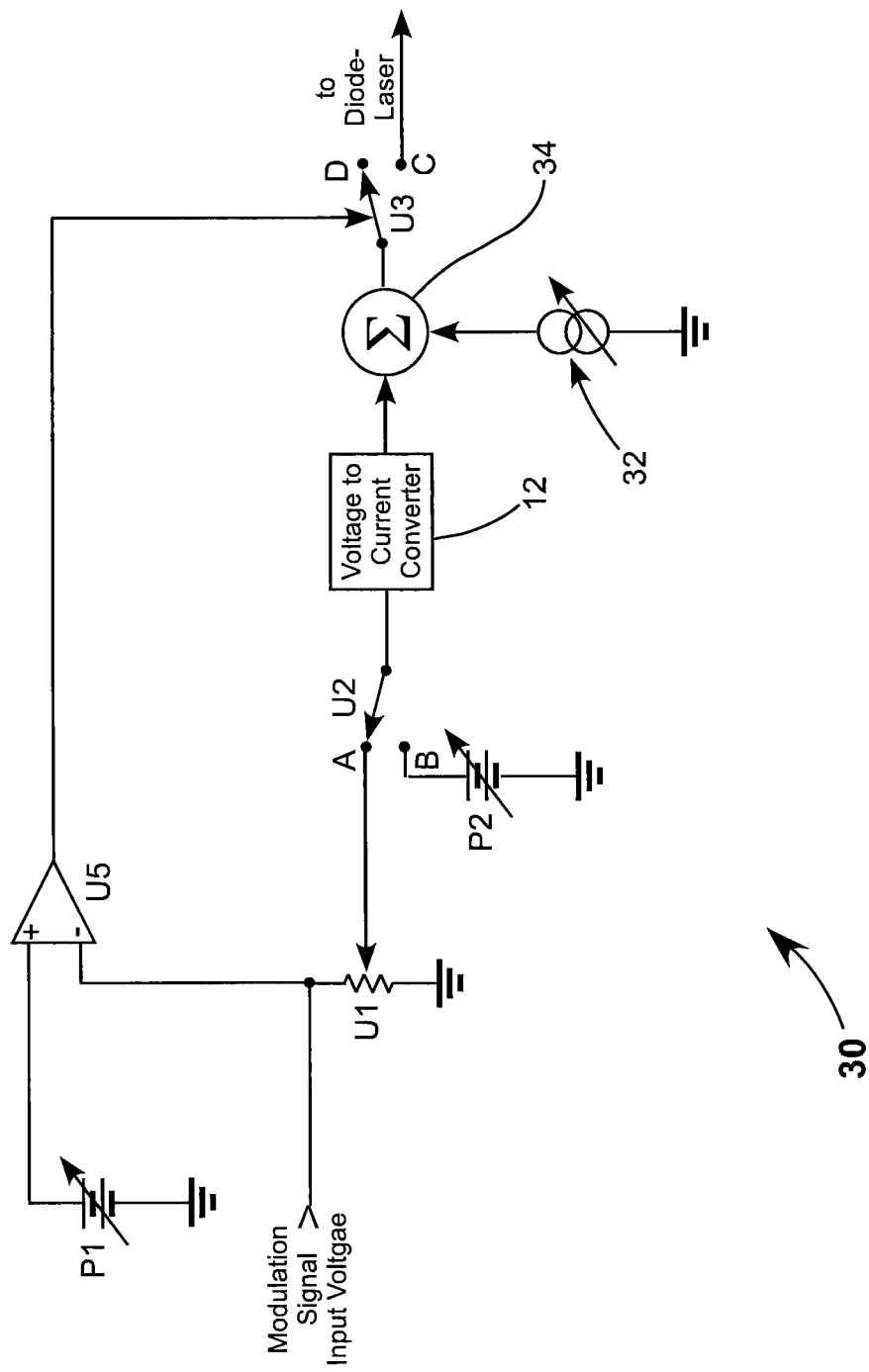
FIG. 7 is a circuit diagram schematically illustrating yet another preferred embodiment of electronic apparatus in accordance with the present invention for driving an analog-modulated diode-laser, similar to the apparatus of FIG. 3 but wherein the input to the voltage-to-current converter has only a modulated component for generating a modulated current and a fixed bias current is added to the modulated current output from the converter.

FIG. 7 is a circuit diagram schematically illustrating yet another preferred embodiment 30 of electronic apparatus in accordance with the present invention for driving an analog-modulated diode-laser. Apparatus 30 is similar to apparatus 10 of FIG. 3 with an exception that only a modulated voltage (between predetermined high and low extreme values) is delivered to voltage-to-current converter 12. This, of course, causes the immediate output of the converter to be a correspondingly modulated current. In apparatus 30 the DC bias level of the current is added to or, if the minimum of the modulated current is non-zero, supplemented by current supplied from a selectively variable current generator 32 and summed with modulated current from converter 12 by a wire connection 34. In apparatus 30, blanking switch U3 is triggered in the same way as in apparatus 10 of FIG. 3, i.e., when the modulation signal voltage falls below the set level applied to comparator, blanking switch U3 is triggered into the D position, thereby disconnecting the diode laser from the current source. Here again, if the input voltage signal, having been below the set level, rises above the set level, switch U3 is triggered back to position C and current is now supplied to the diode-laser.

Figure 8:
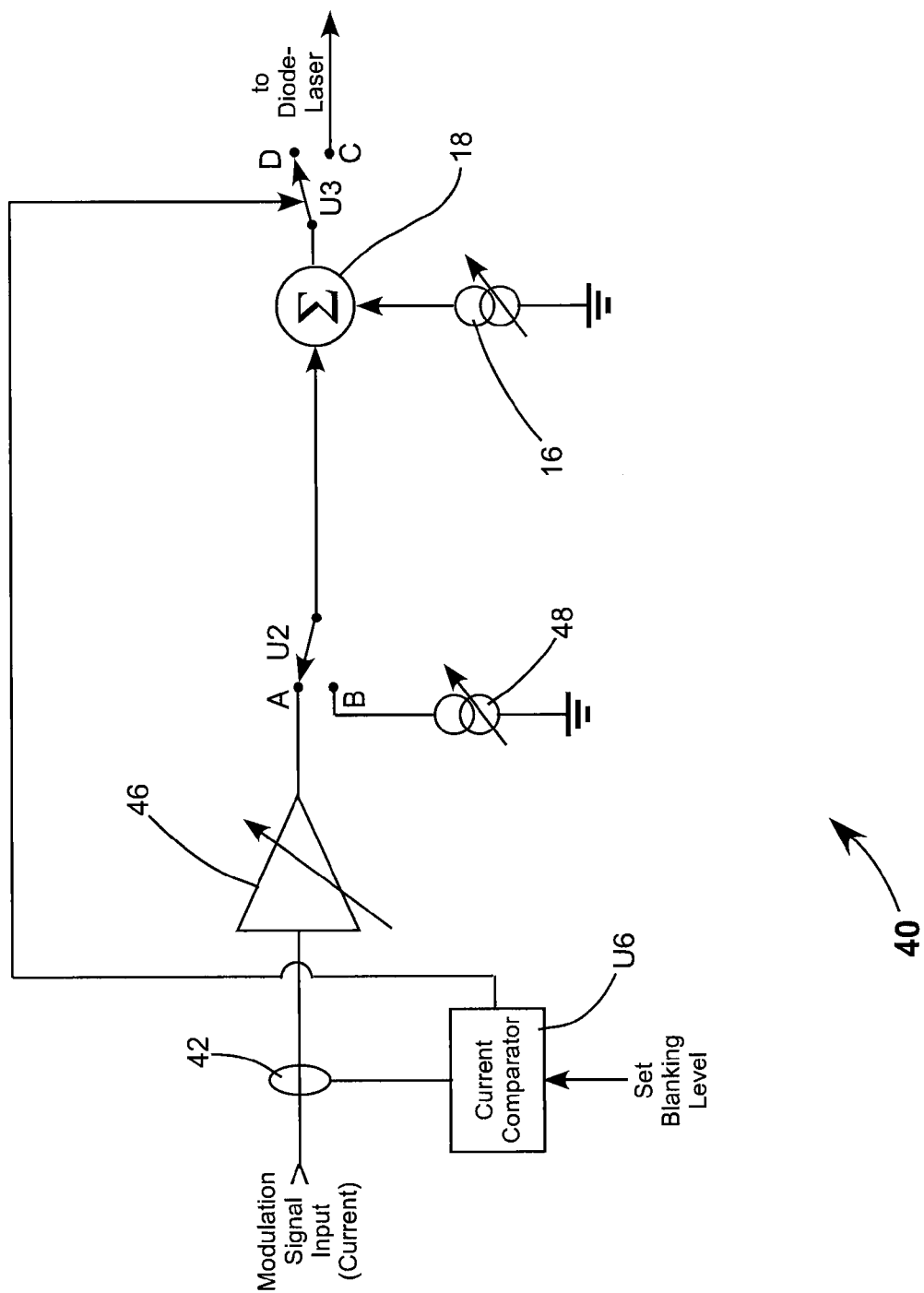
FIG. 8 schematically illustrates still another preferred embodiment of electronic apparatus in accordance with the present invention for driving an analog-modulated diode-laser, similar to the apparatus of FIG. 7 but wherein the voltage to current converter is omitted, and the modulation signal is a modulated current from a generator external to the circuit.

FIG. 8 schematically illustrates still another preferred embodiment 40 of electronic apparatus in accordance with the present invention for driving an analog-modulated diode-laser. Apparatus 40 is similar to apparatus 30 of FIG. 7 inasmuch as bias is provided as a current by generator 16 and summed with modulated current from U2 by a wire connection 18. Connecting the two current sources together with a wire effectively sums the two current sources together. In apparatus 40, however, voltage-to-current converter 12 of apparatus 30 is omitted and the modulated component of driving current is supplied by modulation signal in the form of a modulated current generated external to the circuit. The current signal is amplified if necessary by a variable amplifier 46 and supplied to wire connection 18 via switch U2. A selectively variable DC current generator 48 is provided for driving the diode-laser in an un-modulated (steady-state) mode and can be connected to wire connector 18 by switch U2.

As the modulation signal in apparatus 40 is a current signal, voltage comparator U5 of apparatus 30 is substituted in apparatus 40 by a current-comparator U6. The modulation signal is sampled by a current-sensor loop 42 and the sample is provided to the current-comparator where it is compared with an externally supplied set or blanking level. Here, yet again, if the sampled current falls below the set level applied to comparator, the comparator triggers switch U3 into the D position, thereby disconnecting the diode laser from the current source and switching the diode-laser off. If the sampled current, having been below the set level, rises above the set level, switch U3 is triggered back to position C and current is now supplied to the diode-laser, thereby switching the diode-laser back on. Current comparator circuits suitable for use as comparator U6 are well known to practitioners of the art, and a detailed description thereof is not necessary for understanding principles of the present invention. Accordingly, such a detailed description is not presented herein.

Figure 9:
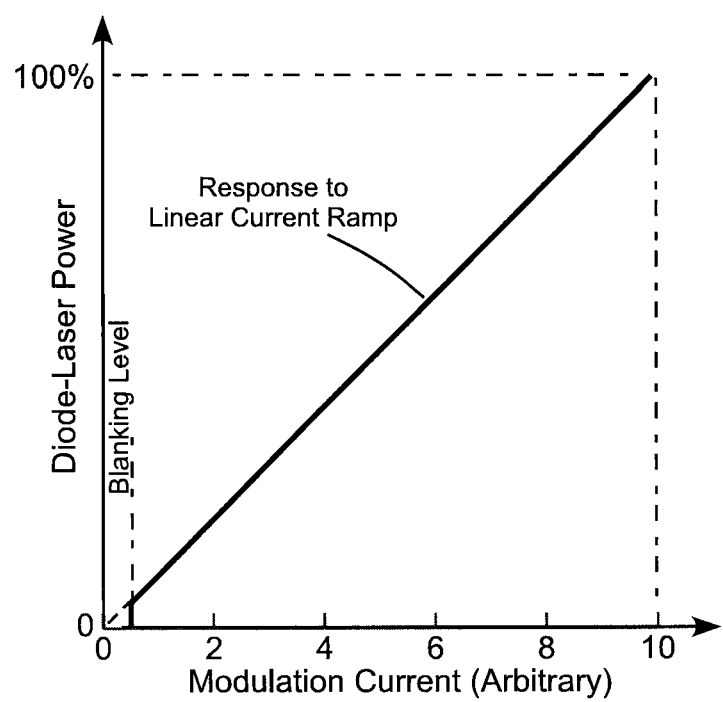
FIG. 9 is a graph schematically illustrating diode-laser power-output as a function of the modulated input current in the apparatus of FIG. 8.

FIG. 9 is a graph schematically illustrating diode-laser power-output as a function of the modulated input current in the apparatus of FIG. 8. The response to the modulation signal is essentially identical with that of FIG. 4 with an exception that the signal is a current signal rather than a voltage signal.

Recapitulating here, four embodiments of the inventive analog modulated diode-laser driving apparatus are described above. In each embodiment it is desired to avoid driving-current for a diode-laser reaching a value at which the diode-laser emits spontaneous emission or fluorescence when no output at all is required by an analog modulation signal. In each embodiment this is achieved by monitoring the modulation signal and, if monitored signal falls with a range between predetermined minimum and maximum values, switching off the diode-laser. Those skilled in the art may devise other apparatus for achieving this, without departing from the spirit and scope of the present invention. The present invention is not limited to the embodiments described and depicted herein. Rather the invention is limited only by the claims appended hereto.

What is claimed is:

1. A method of driving an analog-modulated diode-laser, comprising the steps of:
    providing an analog modulation signal corresponding to a desired modulation profile for the diode-laser, the magnitude of the modulation signal varying in a range between predetermined first and second extreme values with one of the minimum and maximum values representing zero output of the diode laser;
    generating an analog modulated drive-current, the drive-current being the sum of a DC component and modulated component, the modulated component related to the modulation signal;
    driving the diode-laser with the drive-current to provide laser-output;
    monitoring the magnitude of the modulation signal a component of which is used to generate the modulated drive current and comparing the monitored modulation signal with a predetermined set value within the range between the extreme values; and
    if the magnitude of the monitored modulation signal falls between the set value and the said one of the extreme values of the modulation signal representing a desired zero output of the diode laser, switching off the drive current.

2. The method of claim 1, wherein the extreme value representing zero output of the diode-laser is a minimum value.

3. The method of claim 2, wherein the minimum value of the modulation signal is zero.

4. The method of claim 1, wherein the modulation signal is a voltage signal.

5. The method of claim 4, wherein the modulated component of the drive-current is directly related to the modulation signal.

6. The method of claim 4, wherein the modulated component of the drive signal is inversely related to the modulation signal.

7. The method of claim 1, wherein the modulation signal is a current signal.

8. The method of claim 1, wherein the DC component of the drive-current is about equal to a threshold drive-current above which the diode-laser emits laser-radiation.

9. The method of claim 8, wherein the DC component of the drive-current is selected such that the diode-laser output is about linearly related to the modulated component.

10. The method of claim 1, wherein the DC component and the modulated component of the drive-current are selectively variable.

11. A method of driving an analog-modulated diode-laser, comprising:
providing an analog modulation voltage signal corresponding to a desired modulation profile for the diode-laser, the magnitude of the modulation voltage signal varying in a range between predetermined minimum and maximum values with the minimum value of the modulation signal representing zero output of the diode-laser;
generating an analog modulated drive-voltage corresponding to the modulation signal, the modulated drive-voltage being the sum of a fixed bias-voltage component and a varying voltage component corresponding to the modulation signal voltage;
converting the drive-voltage to a drive-current proportional to the drive-voltage;
driving the diode-laser with the drive-current to provide laser-output;
monitoring the magnitude of the modulation voltage signal used to generate the modulated drive voltage and comparing the monitored modulation voltage signal with a predetermined set value within the range between the minimum and maximum values and close to the minimum value; and
if the magnitude of the monitored modulation signal falls below the set level, switching the drive-voltage to zero, thereby switching the drive current to zero and switching off the diode-laser output.

12. The method of claim 11, wherein the fixed bias level of the modulated drive-voltage is about equal to a threshold drive-voltage above which the diode-laser emits laser radiation.

13. The method of claim 12, wherein the fixed bias level is selected such that the diode-laser output is linearly related to the varying voltage.

14. The method of claim 12 wherein the minimum value of the modulation signal is zero.

15. A drive circuit for diode laser, said circuit for receiving an analog modulating input signal varying in a range between predetermined first and second extreme values with one of the minimum and maximum values representing zero output of the diode laser said drive circuit for generating an analog modulated output current in response to the input signal, said output current for driving the laser and wherein below a threshold current, the laser will generate spontaneous non-laser emissions and above the threshold current, the laser will generate laser light, the circuit comprising:
an input node for receiving the modulated input signal;
an output node for supplying the modulated drive current to the laser;
one or more elements located between the input and the output nodes for converting the modulated input signal to the modulated drive current, with the magnitude of the modulated drive current being directly dependent upon the magnitude of the modulated input signal, with the magnitude of the modulated input signal being monitored and compared to a predetermined set value within the range between the extreme values and corresponding to the threshold current; and
a switch located between the input and the output nodes, said switch movable between a closed position permitting the drive current to be delivered to the laser and an open position which prevents the drive current from reaching the laser, said switch being controlled to move to the open position when the magnitude of the monitored input signal crosses the set value indicative of the drive current dropping below said threshold current.

16. A drive circuit as recited in claim 15, including a comparator for comparing the modulated input signal to a predetermined value and for controlling the switch in response to said comparison.

17. A drive circuit as recited in claim 16, wherein the modulated input signal is a voltage and wherein the one or more elements includes a voltage to current converter.

18. A drive circuit as recited in claim 17, wherein said voltage to current converter is an inverting voltage to current converter.

19. A drive circuit as recited in claim 17, wherein the switch is positioned between the input node and the voltage to current converter.

20. A drive circuit as recited in claim 15, wherein the modulated input signal is converted into the modulated drive current in a manner such that the diode-laser output is linearly related to the modulated input signal.

* * * * *